US007012284B2

United States Patent
Choi et al.

(10) Patent No.: US 7,012,284 B2
(45) Date of Patent: Mar. 14, 2006

(54) NITRIDE SEMICONDUCTOR LIGHT EMITTING DEVICE AND METHOD OF MANUFACTURING THE SAME

(75) Inventors: Seok Beom Choi, Daejeon (KR); Bang Won Oh, Kyungki-do (KR); Hee Seok Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/837,780

(22) Filed: May 4, 2004

(65) Prior Publication Data

US 2005/0077536 A1    Apr. 14, 2005

(30) Foreign Application Priority Data

Oct. 10, 2003    (KR) .................... 10-2003-0070609

(51) Int. Cl.
*H01L 33/00*    (2006.01)
(52) U.S. Cl. .................... 257/103; 257/79; 257/94; 257/97; 257/12; 257/13; 438/22; 438/24; 438/46; 438/47
(58) Field of Classification Search ................ 257/12, 257/13, 79, 94, 97; 438/22, 24, 46, 47
See application file for complete search history.

(56) References Cited

U.S. PATENT DOCUMENTS 5,563,422 A    10/1996    Nakamura et al.
6,541,798 B1 *    4/2003    Koike et al. .................. 257/94

FOREIGN PATENT DOCUMENTS

KR    10-2001-0068551    7/2001
KR    10-2002-0021247    3/2002

* cited by examiner

*Primary Examiner*—Mai-Huong Tran
(74) *Attorney, Agent, or Firm*—Lowe Hauptman & Berner, LLP

(57) ABSTRACT

Disclosed herein is a nitride semiconductor light emitting device. The nitride semiconductor light emitting device comprises an n-type nitride semiconductor layer on a substrate, an active layer formed on the n-type nitride semiconductor layer so that a portion of the n-type nitride semiconductor layer is exposed, a p-type nitride semiconductor layer formed on the active layer, a high-concentration dopant area on the p-type nitride semiconductor layer, a counter doping area on the high-concentration dopant areas, an n-side electrode formed on an exposed portion of the n-type nitride semiconductor layer, and a p-side electrode formed on the counter doping area. A satisfactory ohmic contact for the p-side electrode is provided by an ion implantation process and heat treatment.

22 Claims, 2 Drawing Sheets

NITRIDE SEMICONDUCTOR LIGHT EMITTING DEVICE AND METHOD OF MANUFACTURING THE SAME

BACKGROUND OF THE INVENTION

1. Field of the Invention

The present invention relates to a semiconductor light emitting device, and more particularly to a high brightness nitride-based semiconductor light emitting device and a method of manufacturing the same, which forms an ohmic contact for a p-side electrode using an ion implantation process, thereby replacing a conventional transparent conductive layer of Ni/Au.

2. Description of the Related Art

In general, a nitride-based semiconductor is used for a light emitting diode for emitting light in a wavelength range of a blue light or a green light and usually comprises a semiconductor material with the formula $Al_xIn_yGa_{(1-x-y)}N$ (where $0 \leq x \leq 1$, $0 \leq y \leq 1$, $0 \leq x+y \leq 1$).

For the light emitting device generating a green light, a gallium nitride (GaN) semiconductor material with a large energy band gap of about 3.4 eV is used. Like the GaN semiconductor material, as the nitride-based semiconductor has a large energy band gap, there is a difficulty in achieving an ohmic contact with an electrode therein. More specifically, a contact resistance at a p-side electrode increases, causing a rise in operating voltage and the amount of heat. As for a method for providing the ohmic contact, various methods have been suggested. However, since an ohmic contact portion is provided as a primary light emitting plane, it is needed to satisfy a requirement of ensuring a transmission of light generated from an active layer through the light emitting plane. Thus, only a few methods could be restrictively adopted in practice as a method for lowering the contact resistance.

As to a conventional method satisfying the requirement, U.S. Pat. No. 5,563,422 entitled "Nitride gallium-based III-IV compound semiconductor device and method of producing the same," which is assigned to Nichia Chemical Industry Limited, discloses a transparent electrode layer using a bi-layer of Ni/Au. FIG. 1 shows a light emitting device according to an embodiment of the disclosure.

As shown in FIG. 1, a nitride semiconductor light emitting device 10 of the prior art comprises an n-type GaN clad layer 13, a GaN/InGaN active layer 15 having a multi-well structure and a p-type GaN clad layer 17, which are sequentially formed on the substrate 11 in this order. In the nitride semiconductor light emitting device 10, a portion of the p-type GaN clad layer 17 and GaN/InGaN active layer 15 is removed to expose a portion of the n-type GaN clad layer 13. After forming an n-side electrode 19a on the n-type GaN clad layer 13 and a transparent electrode 18 of Ni/Au for providing the ohmic contact on the p-type GaN clad layer 17, a p-side bonding electrode 19b is prepared. The transparent electrode 18 is a translucent layer for lowering the contact resistance and can be formed through a deposition process of a bi-layer of Ni/Au and a subsequent annealing treatment.

It is desirable that the transparent electrode 18 is formed as thick as possible in order to improve current injection efficiency. However, since the transparent electrode 18 is formed of metallic materials, it may be difficult for the transparent electrode to have a desired transmittance. Even though a NiO layer of a relatively high translucency can be formed through the annealing treatment, this layer has a transmittance of merely 60%, so that light emitting efficiency can be deteriorated when thickening the transparent electrode. Thus, the transparent electrode should be limited to a thickness of 100 μm or less, causing a restriction in improving the current injection efficiency.

Further, even though the transparent electrode made of the metallic materials is formed to have an adequate thickness in consideration of a desired transmittance, it inevitably encounters some deterioration in brightness due to a limited transmittance of the transparent electrode.

Thus, there is a need in the art to provide a new light emitting device and a method of manufacturing the same, which can improve the contact resistance without deteriorating the brightness for a reduction in transmittance, unlike the conventional method using the transparent electrode.

SUMMARY OF THE INVENTION

The present invention has been made to solve the above problems, and it is an object of the present invention to provide a high-brightness light emitting diode having a high-concentration counter doping area on a p-type clad layer formed with a p-side electrode, in order to enhance current injection efficiency in a surface by improving a contact resistance without deteriorating transmittance.

It is another object of the present invention to provide a method of manufacturing a high-brightness light emitting diode with enhanced current injection efficiency by forming a high-concentration counter doping area on a p-type clad layer using an ion implantation process and a heat treatment process.

In accordance with an aspect of the present invention, the above and other objects can be accomplished by the provision of a nitride semiconductor light emitting device comprising an n-type nitride semiconductor layer formed on a substrate, an active layer formed on the n-type nitride semiconductor layer so that a portion of the n-type nitride semiconductor layer is exposed, a p-type nitride semiconductor layer formed on the active layer, a high-concentration dopant area formed by doping p-type dopant in a high concentration on the p-type nitride semiconductor layer, a counter doping area formed by doping n-type dopant in a high concentration on the high-concentration dopant area, an n-side electrode formed on an exposed portion of the n-type nitride semiconductor layer, and a p-side electrode formed on the counter doping area.

The p-type dopant of the high-concentration dopant area may comprise at least one selected from the groups consisting of Zn, Be, Mg and Cd, and the n-type dopant of the counter doping area may comprise Si.

The p-side electrode may be formed of Al and Ti rather than Au/Ni, as is used in conventional transparent electrodes, and may be formed using identical processes for forming the n-type electrode.

The p-type dopant in the high-concentration dopant area may have a concentration of $1\times10^{18} \sim 1\times10^{19}/cm^3$, and in this case, the n-type dopant in the counter doping area may have a concentration of $1\times10^{18} \sim 1\times10^{20}/cm^3$.

According to the present invention, the p-type nitride semiconductor layer may have a thickness of 0.2~0.5 μm thicker than the general p-type nitride semiconductor layer, in consideration of a thickness of the high-concentration dopant area and counter doping area.

The high-concentration dopant area may have a thickness of 0.01~0.1 μm, and the counter doping area may have a thickness of 0.01~0.1 μm.

The high-concentration dopant area and the counter doping area may be formed using an ion implantation process and a rapid thermal annealing (RTA) process on the p-type clad layer.

In accordance with another aspect of the present invention, there is provided a method of manufacturing the nitride semiconductor light emitting device as described above.

The method comprises the steps of: a) forming an n-type nitride semiconductor layer on a substrate; b) forming an active layer on the n-type nitride semiconductor layer so that a portion of the n-type nitride semiconductor layer is exposed; c) forming a p-type nitride semiconductor layer on the active layer; d) forming a high-concentration dopant area by doping p-type dopant in a high concentration on the p-type nitride semiconductor layer and forming a counter doping area by doping n-type dopant in a high concentration on the high-concentration dopant area; e) forming an n-side electrode and a p-side electrode on an exposed portion of the n-type nitride semiconductor layer and on the counter doping area, respectively.

In accordance with the present invention, the step d) may be executed using an ion implantation process and a rapid thermal annealing (RTA) process. Specifically, the step d) may comprise the steps of: d-1) implanting p-type dopant ions in a high concentration on the p-type nitride semiconductor layer; d-2) implanting n-type dopant ions in a high concentration on the p-type dopant area; and d-3) rapidly annealing the n-type dopant area and the p-type dopant area which are doped in a high concentration.

Here, the step d-1) and the step d-2) may comprise the step of implanting the respective dopant ions with an energy of about 100~200 KeV, respectively, and the step d-3) may be executed at a temperature of about 600° C.~1,200° C.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 2:
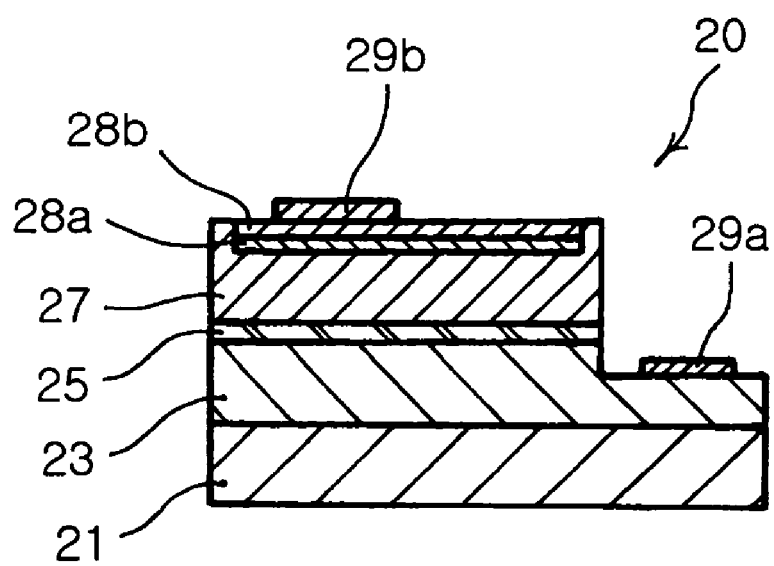
FIG. 2 is a side-sectional view of a light emitting device according to the present invention.

FIG. 2 is a side-sectional view of a nitride semiconductor light emitting device according to an embodiment of the present invention.

Figure 1:
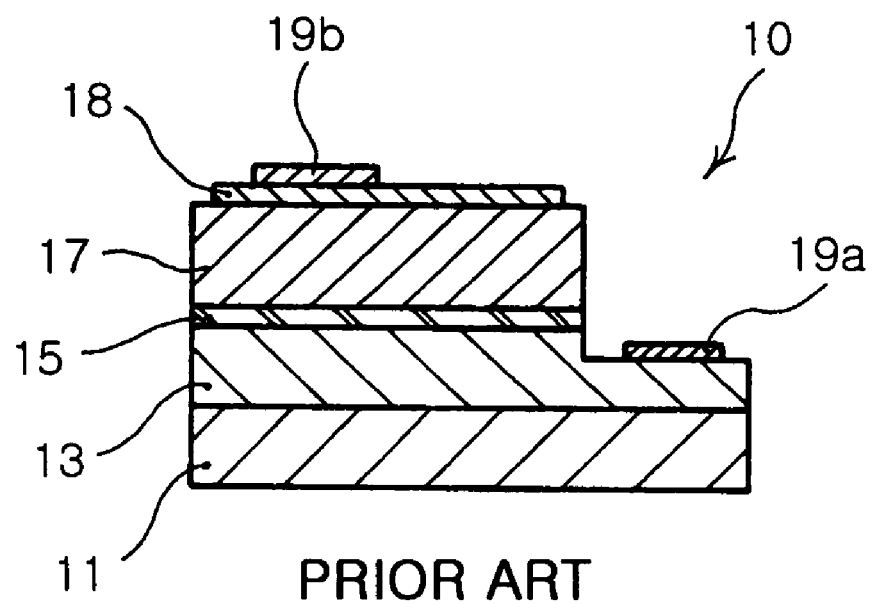
FIG. 1 is a side-sectional view showing a conventional light emitting device.

Referring to FIG. 2, similar to the light emitting device 10 shown in FIG. 1, the nitride semiconductor light emitting device 20 of the present invention comprises an n-type GaN clad layer 23, a GaN/InGaN active layer 25 having a multi-well structure and a p-type GaN clad layer 27, which are sequentially formed on the substrate 21 in this order. In the nitride semiconductor light emitting device 20, a portion of the p-type GaN clad layer 27 and GaN/InGaN active layer 25 is removed to expose a portion of the n-type GaN clad layer 23. An n-side electrode 29a is formed on the n-type GaN clad layer 23 in a similar manner to the prior art, while a p-side electrode 29b is provided by forming an ohmic contact on the p-type GaN clad layer 27, which is different from the method of the prior art.

According to the embodiment of the present invention, the nitride semiconductor light emitting device 20 comprises a dopant area 28a doped with p-type dopant in a high concentration on the p-type clad layer 27 formed with the p-side electrode 29b, and a counter doping area 29a doped with n-type dopant in a high concentration on the dopant area 28a. The p-type dopant forming the high-concentration dopant area 28a may comprise at least one selected from the groups consisting of Zn, Be, Mg and Cd, and the n-type dopant forming the counter doping area 28b may comprise Si.

The high-concentration p-type dopant area 28a has a higher concentration compared with that of the p-type clad layer. Preferably, the p-type dopant area 28a may have a dopant concentration of $1 \times 10^{18} \sim 1 \times 10^{19}/cm^3$. Further, the counter doping area 28b is formed to have a sufficient n-type dopant concentration to provide a tunneling-effect at the interface on the p-type dopant area. Preferably, the counter doping area 28b may have an n-type dopant concentration of $1 \times 10^{18} \sim 1 \times 10^{20}/cm^3$. Thus, the high-concentration dopant area and the counter doping area may have the same I-V property as that of Zener diodes which uses the tunneling effect.

In general, the p-type nitride layer is formed to have a thickness of 0.2~0.3 μm and the p-type nitride layer 27 of the invention can also have this general thickness. However, the p-type clad layer 27 is preferably formed to have a thickness of 0.2~0.5 μm, which is thicker than the general thickness thereof, in consideration of a thickness of the high-concentration dopant area 28a and counter doping area 28b. Preferably, the high-concentration dopant area 28a and the counter doping area 28b are formed as thin as possible in order to have a lower resistance. The high-concentration dopant area 28a and the counter doping area 28b preferably have a thickness of 0.1 μm or less, respectively. More preferably, in order achieve sufficient characteristics, these areas (28a, 28b) have a thickness of 0.01 μm~0.1 μm, respectively.

The high-concentration dopant area 28a and the counter doping area 28b of the invention are formed using an ion implantation process doping an adequate dose of impurity on the p-type clad layer 27 and a rapid thermal annealing (RTA) treatment after the implantation process.

As such, the present invention can provide the ohmic contact using the tunneling effect by providing the high-concentration p-type dopant area and the counter doping area on the p-type clad layer. Thus, current efficiency on the surface of the p-type clad layer can be enhanced without forming the transparent electrode using the metals, such as Au/Ni, while the brightness can also be significantly enhanced by not using the metallic transparent electrode of a low transmittance. Further, the p-side electrode can be formed of metals including Al and Ti, the same as those of the n-type electrode, thereby benefiting to the process in that both electrodes can be formed at the same time by one photoresist process.

A method of manufacturing the nitride semiconductor light emitting device of the present invention will now be described in detail with reference to FIGS. 3a to 3e.

FIGS. 3a to 3e are sectional views of a flow diagram illustrating a method of the light emitting device according to an embodiment of the present invention.

Figure 3:
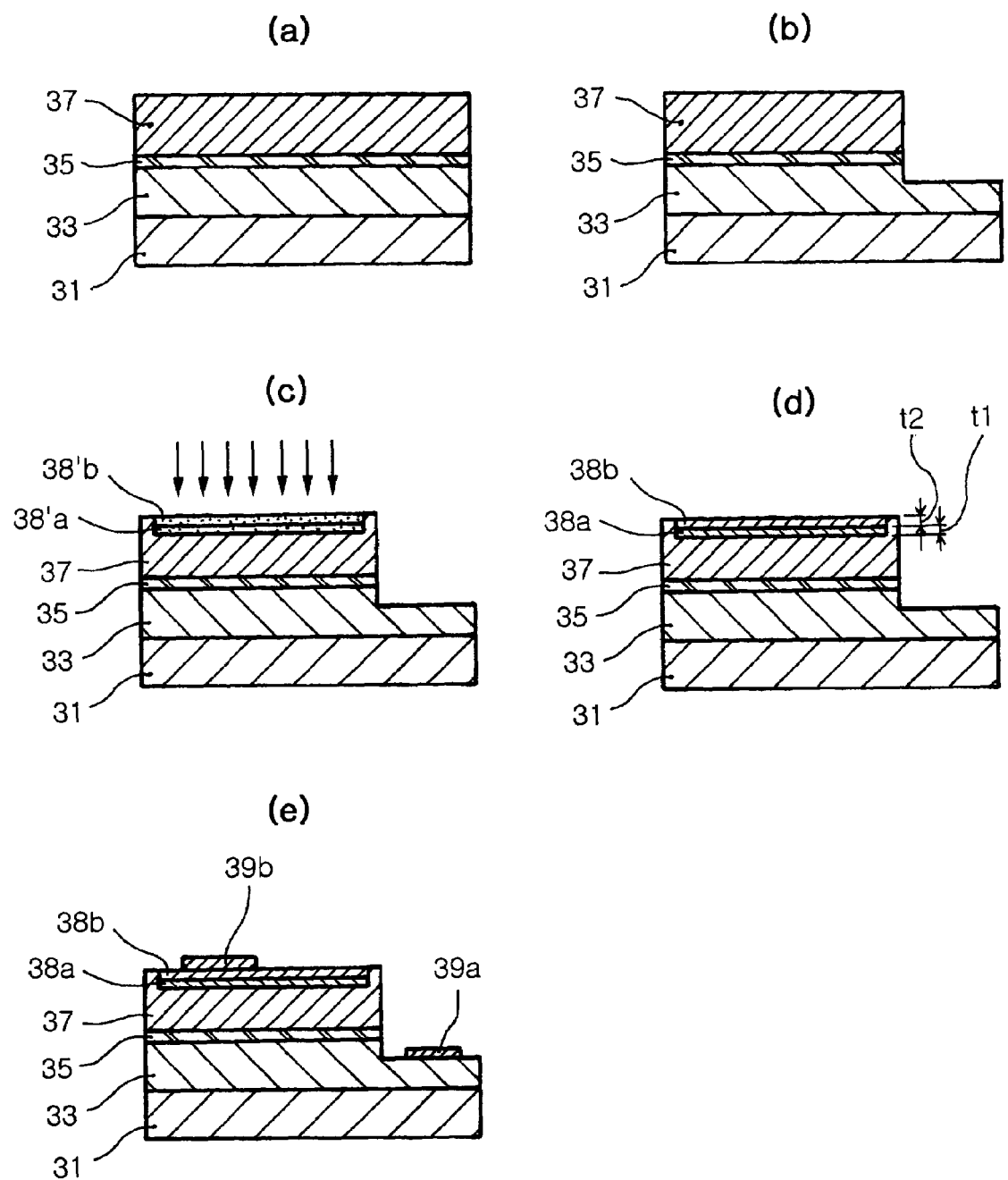
FIGS. 3a to 3e are cross-sectional views of a flow diagram illustrating a method of the light emitting device according to the present invention.

Referring to FIG. 3a, the method of the light emitting device of the present invention starts from the step of forming an n-type nitride semiconductor layer 33, an active layer 35, and a p-type nitride semiconductor layer 37 on the substrate 31 in this order. The p-type and n-type nitride semiconductor layers 33 and 37, and the active layer 35 may comprise semiconductor materials with the formula $Al_x In_y Ga_{(1-x-y)}N$ (where $0 \leq x \leq 1$, $0 \leq y \leq 1$, $0 \leq x+y \leq 1$). The substrate 31 may comprise a sapphire substrate appropriate for growth of a nitride semiconductor. The p-type and n-type nitride semiconductor layers 33 and 37, and the active layer 35 can be formed using a well-known deposition process, such as the MOCVD process or the MBE process.

Subsequently, as shown in FIG. 3b, a mesa etching process is carried out for removing a portion of the p-type nitride semiconductor layer 37 and active layer 35 to expose a portion of the n-type nitride semiconductor layer 33. The light emitting device of the present invention employs a dielectric substrate, such as the sapphire substrate, for growing the nitride semiconductor layer. Thus, the mesa etching process for removing the portion of the n-type nitride semiconductor layer 33 is carried out in order to form an n-side electrode 39a in FIG. 3e, which is connected with the n-type nitride semiconductor layer 33.

Next, as shown in FIG. 3c, p-type dopant area 38a' is formed on the p-type nitride semiconductor layer 37 by implanting the p-type dopant ions, and then n-type dopant area 38b' is formed thereon by implanting the n-type dopant ions in a high concentration. The p-type dopant area 38a' and the n-type dopant area 38b' are prepared to include at least areas on which a p-side electrode 39b in FIG. 3e will be formed. The p-type dopant comprises at least one dopant selected from the group of Zn, Be, Mg and Cd, while the n-type dopant comprises Si. An adequate dose of the ion implantation process is preferably at least $5 \times 10^{14}$ or more. An ion implantation depth is determined in consideration of the dopant concentrations in the respective areas provided after a subsequent heat treatment process. Preferably, the ion implantation process is carried out with an energy of about 100~200 KeV.

Then, the heat treatment process for the ion-implanted p-type and n-type dopant areas 38a' and 38b' is carried out. With this process, as shown in FIG. 3d, these dopant areas 38a' and 38b' can be formed to a high-concentration p-type dopant area 38a and a counter doping area 38b having desired profiles, respectively. In this process, the heat treatment process employs the RTA process, and preferably carried out at a temperature of about 600° C.~1200° C. With this process, the high-concentration p-type dopant area 38a may have a dopant concentration of $1 \times 10^{18} \sim 1 \times 10^{19}/cm^3$, and the n-type dopant counter doping area 38b may have a dopant concentration of $1 \times 10^{18} \sim 1 \times 10^{20}/cm^3$. Further, both areas 38a and 38b can be formed to have final depths t1 and t2 of 0.01~0.1 µm, respectively.

In order to achieve desirable depths and concentrations suggested in the present invention, those skilled in the art will properly adjust the ion implantation process and the heat treatment process as described above. That is, in order to form the dopant areas having proper depths and concentrations in the ion implantation process, adequate ranges of the dose of the respective dopant and of the injection energy can be adopted and established by properly changing required conditions of the heat treatment process.

Lastly, an n-side electrode 39a and a p-side electrode 39b are formed on an exposed portion of the n-type nitride semiconductor layer 33 and on the counter doping area 38b, respectively. The p-side electrode 39b can be formed of materials including Al and Ti. Since the material for the electrode can be used as the material for the n-type electrode 39a, the electrodes can be formed with ease by a deposition process using one photoresist pattern.

As apparent from the above description, in accordance with the present invention, in order to provide a satisfactory ohmic contact for the p-side electrode on the p-type nitride semiconductor layer having a large energy band gap, there is provided the method using the tunneling effect by forming the p-type dopant area and the counter doping area on the p-type clad layer. Thereby, the present invention enhances the current injection efficiency on the surface of the p-type clad layer while significantly increasing the brightness, without forming the transparent electrode of a low transmittance, which uses metals such as Au/Ni.

Further, the p-side electrode can be formed of metals including Al and Ti, the same as those of the n-type electrode, thereby benefiting to the process in that both electrodes can be formed at the same time by one photoresist process.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A nitride semiconductor light emitting device, comprising:
    an n-type nitride semiconductor layer formed on a substrate;
    an active layer formed on the n-type nitride semiconductor layer so that a portion of the n-type nitride semiconductor layer is exposed;
    a p-type nitride semiconductor layer formed on the active layer;
    a high-concentration dopant area formed by doping p-type dopant in a high concentration on the p-type nitride semiconductor layer;
    a counter doping area formed by doping n-type dopant in a high concentration on the high-concentration dopant area;
    an n-side electrode formed on an exposed portion of the n-type nitride semiconductor layer; and
    a p-side electrode formed on the counter doping area.

2. The device as set forth in claim 1, wherein the p-type dopant in the high-concentration dopant area comprises at least one selected from the group of Zn, Be, Mg and Cd.

3. The device as set forth in claim 1, wherein the n-type dopant in the counter doping area comprises Si.

4. The device as set forth in claim 1, wherein the p-side electrode comprises Al and Ti.

5. The device as set forth in claim 1, wherein the p-type dopant in the high-concentration dopant area has a concentration of $1 \times 10^{18} \sim 1 \times 10^{19}/cm^3$.

6. The device as set forth in claim 5, wherein the n-type dopant in the counter doping area has a concentration of $1 \times 10^{18} \sim 1 \times 10^{20}/cm^3$.

7. The device as set forth in claim 1, wherein the p-type nitride semiconductor layer has a thickness of 0.2~0.5 µm.

8. The device as set forth in claim 7, wherein the high-concentration dopant area has a thickness of 0.01~0.1 µm.

9. The device as set forth in claim 8, wherein the counter doping area has a thickness of 0.01~0.1 µm.

10. The device as set forth in claim 1, wherein the high-concentration dopant area and the counter doping area are formed using an ion implantation process on the p-type clad layer and a heat treatment process.

11. A method of manufacturing the nitride semiconductor light emitting device, comprising the steps of:
   a) forming an n-type nitride semiconductor layer on a substrate;
   b) forming an active layer on the n-type nitride semiconductor layer so that a portion of the n-type nitride semiconductor layer is exposed;
   c) forming a p-type nitride semiconductor layer on the active layer;
   d) forming a high-concentration dopant area by doping p-type dopant in a high concentration on the p-type nitride semiconductor layer, and a counter doping area by doping n-type dopant in a high concentration on the high-concentration dopant area; and
   e) forming an n-side electrode and a p-side electrode on an exposed portion of the n-type nitride semiconductor layer and on the counter doping area, respectively.

12. The method as set forth in claim 11, wherein the p-type type dopant in the high-concentration dopant area comprises at least one selected from the group of Zn, Be, Mg and Cd.

13. The method as set forth in claim 11, wherein the n-type dopant in the counter doping area comprises Si.

14. The method as set forth in claim 11, wherein the p-side electrode comprises Al and Ti.

15. The method as set forth in claim 11, wherein the p-type dopant in the high-concentration dopant area has a concentration of $1 \times 10^{18} \sim 1 \times 10^{19}/cm^3$.

16. The method as set forth in claim 15, wherein the n-type dopant in the counter doping area has a concentration of $1 \times 10^{18} \sim 1 \times 10^{20}/cm^3$.

17. The method as set forth in claim 11, wherein the p-type nitride semiconductor layer has a thickness of 0.2~0.5 $\mu$m.

18. The method as set forth in claim 17, wherein the high-concentration dopant area has a thickness of 0.01~0.1 $\mu$m.

19. The method as set forth in claim 18, wherein the counter doping area has a thickness of 0.01~0.1 $\mu$m.

20. The method as set forth in claim 11, wherein the step d) comprises the steps of:
   d-1) implanting p-type dopant ions in a high concentration on the p-type nitride semiconductor layer;
   d-2) implanting n-type dopant ions in a high concentration on the p-type dopant area; and
   d-3) rapid thermal annealing the n-type dopant area and the p-type dopant area, which are doped in a high concentration.

21. The method as set forth in claim 20, wherein the step d-1) and the step d-2) comprise the step of implanting the respective dopant ions with an energy of about 100~200 KeV, respectively.

22. The method as set forth in claim 20, wherein the step d-3) comprises the step of rapid thermal annealing at a temperature of about 600~1,200° C.

* * * * *